(12) United States Patent
Gloger et al.

(10) Patent No.: US 10,825,945 B2
(45) Date of Patent: Nov. 3, 2020

(54) METHOD OF PRODUCING DIFFERENTLY DOPED ZONES IN A SILICON SUBSTRATE, IN PARTICULAR FOR A SOLAR CELL

(71) Applicant: Universität Konstanz, Constance (DE)

(72) Inventors: Sebastian Gloger, Constance (DE); Barbara Terheiden, Constance (DE); Daniel Sommer, Constance (DE); Axel Herguth, Constance (DE); Josh Engelhardt, Constance (DE)

(73) Assignee: UNIVERSITÄT KONSTANZ (DE)

( * ) Notice: Subject to any disclaimer, the term of this patent is extended or adjusted under 35 U.S.C. 154(b) by 444 days.

(21) Appl. No.: 15/323,414

(22) PCT Filed: Jun. 29, 2015

(86) PCT No.: PCT/EP2015/064688
§ 371 (c)(1),
(2) Date: Dec. 31, 2016

(87) PCT Pub. No.: WO2016/001132
PCT Pub. Date: Jan. 7, 2016

(65) Prior Publication Data
US 2017/0133538 A1  May 11, 2017

(30) Foreign Application Priority Data

Jul. 1, 2014 (DE) .......................... 10 2014 109 179

(51) Int. Cl.
*H01L 31/068* (2012.01)
*H01L 31/18* (2006.01)
(Continued)

(52) U.S. Cl.
CPC ........ *H01L 31/0682* (2013.01); *H01L 21/223* (2013.01); *H01L 21/2255* (2013.01);
(Continued)

(58) Field of Classification Search
CPC ............. H01L 31/0682; H01L 21/2256; H01L 21/223; H01L 21/2255; H01L 31/1804;
(Continued)

(56) References Cited

U.S. PATENT DOCUMENTS 3,540,951 A * 11/1970 Hans .................... C30B 31/08
                                                                    438/565
7,135,350 B1   11/2006 Smith et al.
(Continued)

FOREIGN PATENT DOCUMENTS

DE   10 2010 024 834 A1   12/2011
DE   11 2011 101 439 T5    4/2013
(Continued)

OTHER PUBLICATIONS

Philip Rothhardt "Co-diffusion from APCVD BSG and POCl3 for industrial n-type solar cells" Energy Procedia 38 ( 2013 ) 305-311.*
(Continued)

*Primary Examiner* — Michael Y Sun
(74) *Attorney, Agent, or Firm* — Dresch IP Law, PLLC; John J. Dresch

(57) ABSTRACT

What is proposed is a method of producing at least two differently heavily doped subzones (3, 5) predominantly doped with a first dopant type in a silicon substrate (1), in particular for a solar cell. The method comprises:
covering at least a first subzone (3) of the silicon substrate (1) in which a heavier doping with the first dopant type is to be produced with a doping layer (7) of borosilicate glass, wherein at least a second subzone (5) of the silicon substrate (1) in which a lighter doping with the first dopant type is to be produced is not covered with the doping layer (7), and wherein boron as a dopant of a second dopant type differing from the first dopant type and oppositely polarized with respect to the same is included in the layer (7), and;
(Continued)

heating the such prepared silicon substrate (1) to temperatures above 300° C., preferably above 900° C., in a furnace in an atmosphere containing significant quantities of the first dopant type. Additionally, at least a third doped subzone (15) doped with the second dopant type may be produced by the method additionally comprising, prior to the heating, a covering of the doping layer (7), above the third doped subzone (15) to be produced, with a further layer (17) acting as a diffusion barrier for the first dopant type.

The method uses the observation that a borosilicate glass layer seems to promote an in-diffusion of phosphorus from a gas atmosphere and may substantially facilitate a manufacturing for example of solar cells, in particular back contact solar cells.

14 Claims, 2 Drawing Sheets

(51) Int. Cl.
| | | |
|---|---|---|
| H01L 21/225 | (2006.01) | |
| H01L 21/223 | (2006.01) | |
| H01L 21/02 | (2006.01) | |
| H01L 31/0376 | (2006.01) | |
| H01L 21/38 | (2006.01) | |
| H01L 21/04 | (2006.01) | |
| H01L 21/22 | (2006.01) | |
| H01L 21/3115 | (2006.01) | |
| H01L 21/4757 | (2006.01) | |
| H01L 21/18 | (2006.01) | |
| H01L 21/24 | (2006.01) | |

(52) U.S. Cl.
CPC ...... *H01L 21/2256* (2013.01); *H01L 31/1804* (2013.01); *H01L 21/0257* (2013.01); *H01L 21/0262* (2013.01); *H01L 21/02129* (2013.01); *H01L 21/02532* (2013.01); *H01L 21/02592* (2013.01); *H01L 21/02631* (2013.01); *H01L 21/02675* (2013.01); *H01L 21/046* (2013.01); *H01L 21/0455* (2013.01); *H01L 21/18* (2013.01); *H01L 21/22* (2013.01); *H01L 21/2205* (2013.01); *H01L 21/24* (2013.01); *H01L 21/3115* (2013.01); *H01L 21/31155* (2013.01); *H01L 21/38* (2013.01); *H01L 21/47576* (2013.01); *H01L 31/03762* (2013.01); *H01L 31/068* (2013.01); *Y02E 10/547* (2013.01); *Y02P 70/50* (2015.11)

(58) Field of Classification Search
CPC ........... H01L 21/2205; H01L 21/31155; H01L 21/3115; H01L 21/0257; H01L 21/38; H01L 21/0455; H01L 21/22; H01L 21/02129; H01L 21/02592; H01L 31/068; H01L 21/0262; H01L 21/02675; H01L 31/03762; H01L 21/02631; H01L 21/02532; H01L 31/032; H01L 31/18; H01L 31/186; H01L 21/47576; H01L 21/18; H01L 21/24; H01L 21/046; Y02E 10/547; Y02P 70/521; Y02P 70/50
See application file for complete search history.

(56) References Cited

U.S. PATENT DOCUMENTS

| | | |
|---|---|---|
| 8,377,738 B2 | 2/2013 | Dennis et al. |
| 2011/0003465 A1 | 1/2011 | Scardera et al. |
| 2011/0003466 A1 | 1/2011 | Scardera et al. |
| 2012/0138138 A1* | 6/2012 | Granek ............... H01L 31/1804 136/256 |
| 2012/0174960 A1* | 7/2012 | Hashigami ........ H01L 31/02167 136/244 |
| 2013/0112260 A1 | 5/2013 | Bazer-Bachi et al. |
| 2013/0267059 A1 | 10/2013 | Kim et al. |
| 2013/0298989 A1* | 11/2013 | Tomizawa ........ H01L 31/03762 136/258 |
| 2014/0065764 A1* | 3/2014 | Scardera ......... H01L 31/022441 438/98 |
| 2014/0174515 A1* | 6/2014 | Molesa ............... H01L 31/0352 136/255 |

FOREIGN PATENT DOCUMENTS

| | | |
|---|---|---|
| DE | 10 2012 204 346 A1 | 9/2013 |
| EP | 2 648 235 A2 | 10/2013 |
| WO | 2011135249 A1 | 11/2011 |
| WO | 2011160814 A2 | 12/2011 |
| WO | 2013/139663 A2 | 9/2013 |
| WO | 2015112569 A1 | 7/2015 |

OTHER PUBLICATIONS

D. Pantelidis, International Search Report for PCT/EP2015/064688 dated Sep. 18, 2015.
Depatisnet, References identified in a search for DE 102014109179 and received in an Office Action dated Mar. 16, 2015.
Janssens T. et al, "Implantation for an excellent definition of doping profiles in Si solar cells", EU PVSEC PROCEEDi NGS: 25th European Photovoltaic Solar Energy Conference and Exhibition / 5th World Conference on Photovoltaic Energy Conversion, Sep. 6-10, 2010, Sep. 6, 2010 (Sep. 6, 2010), pp. 1179-1181, XP040530959, ISBN: 978-3-936338-26-3 p. 1179; figure 1.
Robert Bock et al., "Back-junction back-contact n-type silicon solar cells with screen-printed aluminum-alloyed emitter" Applied Physics Letters 96, 263507 2010, Institut für Solarenergieforschung Hameln/Emmerthal (ISFH), Am Ohrberg 1, D-31860 Emmerthal, Germany, Received May 12, 2010; accepted Jun. 2, 2010; published online Jun. 28, 2010. Download from the internet May 8, 2011.
F. J. Castaño et al., "Industrially Feasible >19% Efficiency IBC Cells for Pilot Line Processing", 37th IEEE Photovoltaic Specialists Conference, Seattle, USA, Jun. 19-24, 2011.
G. Galbiati et al. "Results on n-type IBC solar cells using industrial optimized techniques in the fabrication processing" SiliconPV: Apr. 17-20, 2011, Freiburg, Germany, Published by Elsevier Ltd. 2011.
Chun Gong et al. "High Efficient N-Type Interdigitated Back Contact Silicon Solar Cells With Screen-Printed AL-Alloyed Emitter", Copyrighted 2010 Leuven, Belgium.
Roman Keding et al., "Co-Diffused Back-Contact Back-Junction Silicon Solar Cells without Gap Regions" Published by IEEE Journal of Photovoltaics, vol. 3, No. 4, Oct. 2013.
M.W.P.E. Lamers et al. "Towards 21% Efficient N-CZ IBC Based on Screen Printing", 26th European Photovoltaic Solar Energy Conference and Exhibition, Sep. 5-9, 2011, Hamburg, Germany.
N.E. Posthuma et al., "Development and Analysis of Small Area High Efficiency Interdigtiated Back Contact Silicon Solar Cells", 27th EU-PVSEC, Frankfurt, Germany, 2012.
B. Bazer-Bachi et al., "Co-Diffusion From Boron Doped Oxide and POCL3", 26th European Photovoltaic Solar Energy Conference and Exhibition, Sep. 5, 2011 to Sep. 9, 2011 Messeplatz 1, 20357 Hamburg, German.
Philip Rothhardt et al., "Co-diffusion from solid sources for bifacial n-type silicon solar cells", Received Jul. 5, 2013, revised Jul. 24, 2013, accepted Jul. 26, 2013, Published online Aug. 1, 2013 © 2013 Wiley-VCH Verlag GmbH & Co. KGaA, Weinheim.
Philip Rothhardt et al., "Co-diffusion from APCVD BSG and POCl3 for industrial n-type solar cells", SiliconPV: Mar. 25-27, 2013, Hamelin, Germany, Published by Elsevier Ltd. 2013.
Nadine Wehmeier et al., "Boron-Doped PECVD Silicon Oxides as Diffusion Sources for Simplified High-Efficiency Solar Cell Fabri-

(56) References Cited

OTHER PUBLICATIONS cation", 28th European Photovoltaic Solar Energy Conference and Exhibition, Sep. 30, 2013 to Oct. 4, 2013 Villepinte, Frankreich.

Helge Haverkamp et al., "Minimizing the Electrical Losses on the Front Side: Development of a Selective Emitter Process From a Single Diffusion", Published in Photovoltaic Specialists Conference, 2008. PVSC '08. 33rd IEEE, Date of Conference: May 11-16, 2008.

\* cited by examiner

METHOD OF PRODUCING DIFFERENTLY DOPED ZONES IN A SILICON SUBSTRATE, IN PARTICULAR FOR A SOLAR CELL

FIELD OF THE INVENTION

The present invention relates to a method of producing at least two differently heavily doped subzones in a silicon substrate, in particular for a solar cell. Furthermore, the invention relates to a method of manufacturing a solar cell, in particular a back contact solar cell as well as a respectively manufacturable solar cell.

TECHNOLOGICAL BACKGROUND

Silicon substrates are used in a multitude of applications. As an example, silicon substrates in the form of a wafer or a thin film may be used for manufacturing solar cells or other electronic elements. For this purpose, several subzones are produced in a silicon substrate, mostly adjacent to the surface thereof, the subzones differing from one another with respect to the dopant types and/or dopant concentrations introduced therein. Here, dopants such as e.g. phosphorus may be introduced which release negative charges, i.e. electrons, and are therefore according to their polarity designated as a-type dopants. Alternatively, dopants such as e.g. boron may be introduced which release positive charges, i.e. holes, and are therefore according to their polarity designated as p-type dopants. Depending on which dopant type and which dopant concentration a subzone is predominantly doped with, an electric potential forms therein. By appropriately arranging the subzones, desired functions of a certain semiconductor element may be effected.

In the following, embodiments of the invention are described mainly with respect to a silicon substrate for a manufacturing of a solar cell, as advantages which the invention facilitates may be utilized particularly well in the manufacturing of solar cells. Embodiments of the invention may however also be used for the manufacturing of silicon substrates for other applications, e.g. for microelectronic devices, power semiconductor devices, devices of the memory technology and the like.

Solar cells are used as photovoltaic elements for the conversion of light to electric energy. For this purpose, various doped subzones are provided in a semiconductor substrate such as e.g. a silicon wafer. Due to the different types or densities of charge carriers within the various subzones, a potential difference between neighboring subzones is created at boundary surfaces. By means of such a potential difference, charge carrier pairs, which are generated in proximity to these boundary surfaces by the absorption of light, may be spatially separated.

There has been a development of a multitude of solar cell concepts, where differently doped subzones are created in a silicon substrate in a suitably accustomed geometry in order to achieve desired functionalities such as e.g. an efficient gathering of generated charge carriers, a low shading by metal contacts at a surface of the solar cell facing the sun or the possibility of a good passivation of surfaces of the solar cell. As an example, back contact solar cells have been developed in which both contact types, i.e. contacts contacting p-type zones and contacts contacting n-type zones, are disposed on the back side of the silicon substrate so that there is no contact-induced shading on the sun-facing side of the solar cell and there is the chance to be able to very efficiently passivate particularly the front-side surface of the silicon substrate. Examples of such back contact solar cells include IBC (Interdigitated Back Contact) solar cells, where contact fingers for contacting both polarities are disposed nested into one another on the back-side surface of a silicon substrate.

Conventionally, there are different methods to produce differently doped subzones in a silicon substrate in the manufacturing of silicon solar cells.

By way of example, those subzones to be doped with a certain dopant type may, in a furnace at high temperatures, be subjected to an atmosphere which contains this dopant type so that dopants are able to accumulate on the surface of the silicon substrate and diffuse into the silicon substrate. Conventionally, subzones of the silicon substrate not to be doped are mostly protected from dopant accumulation and in-diffusion by means of a masking layer. E.g, layers of silicon oxide or silicon nitride of a suitable thickness are used as masking layers. Doped subzones of different polarities may generally be produced in a silicon substrate by successively subjecting the silicon substrate to different atmospheres with different dopants, whereby previously, in each case, the subzones not to be doped are masked. Doped subzones of the same polarity but different dopant concentrations and therefore different electric conductivities may e.g. be produced by initially homogenously in-diffusing dopants across an entire zone and then etching back individual subzones.

Alternatively, differently doped subzones may be produced by e.g. disposing dopant-charged layers onto the surfaces of the subzones to be doped and subsequently heating up the silicon substrate together with the layers disposed thereon in order to diffuse the dopants from the layers into the silicon substrate.

DISCLOSURE OF THE INVENTION

There may be a need for an alternative method of producing at least two differently heavily doped subzones predominantly doped with a first dopant type in a silicon substrate, wherein the silicon substrate may be used for a solar cell in particular. There may further be a need for a method of manufacturing a solar cell utilizing the aforementioned method as well as for a solar cell which may be produced by the aforementioned method. The methods mentioned may be easily implemented. Particularly, two, three or more differently doped subzones may be produced in a silicon substrate in one common process.

Such a need may be met by a method or by a solar cell of the independent claims of the present patent application. Advantageous embodiments are defined in the dependent claims.

According to a first aspect of the invention, there is proposed a method of producing at least two differently heavily doped subzones predominantly doped with a first dopant type in a silicon substrate. The silicon substrate may particularly be used for the manufacturing of a solar cell. The method comprises the steps described below in the given order;

Covering at least a first subzone of the silicon substrate in which a heavier doping with the first dopant type is to be produced with a doping layer of borosilicate glass, wherein at least a second subzone of the silicon substrate in which a lighter doping with the first dopant type is to be produced is not covered with the doping layer, and wherein in the doping layer boron as a dopant of a second dopant type which differs from the first dopant type and is oppositely polarized to the same is included.

Heating the such prepared silicon substrate to temperatures above 800° C., preferably above 900° C., in a furnace in an atmosphere containing significant quantities of the first dopant type.

According to a second aspect of the invention, a method of manufacturing a solar cell, in particular a back contact solar cell, is proposed. The method comprises the following steps, preferably in the given order:

Providing the silicon substrate;

Producing at least two subzones differently heavily doped with a first dopant type in the silicon substrate by an embodiment of the above mentioned method according to the first aspect of the invention;

Producing metal contacts for electrically contacting various doped subzones of the silicon substrate.

According to a third aspect of the invention, a silicon solar cell in particular a back contact solar cell such as e.g. an IBC solar cell, is proposed. The solar cell comprises at least two differently heavily predominantly n-type doped subzones adjacent to a surface of a silicon substrate. In a first subzone of the silicon substrate, in which a heavier n-type doping is introduced, additionally, a weak p-type doping overcompensated by the n-type doping is introduced. In a second subzone of the silicon substrate, in which a lighter n-type doping is introduced, essentially no p-type doping is introduced. Here, the p-type doping introduced into the first subzone has a doping profile exhibiting a substantially steeper exponential decline of a doping concentration close to a surface of the silicon substrate than further removed from the surface of the silicon substrate.

In the following, possible details, possible advantages and possible modes of action of the invention are specified using the example of embodiments. Ideas on the above mentioned aspects and on embodiments of the invention may be regarded, among other things, as based on the thoughts and findings described in the following.

As illustrated in the introduction, with respect to the conventional manufacturing methods of solar cells or generally in producing differently doped subzones in a silicon substrate, it has been assumed that, as a rule, the various subzones must be produced one after the other in several processing steps. In particular, it did not seem possible to produce both p-type doped subzones and n-type doped subzones with different doping concentrations in one single processing step.

It has been recognized that, by a suitable choice, on the one hand, of layers with which individual ones of the subzones to be doped of the silicon substrate surface are covered and, on the other hand, of parameters which are set when heating the silicon substrate for the in-diffusion of dopants, synergy effects may be achieved which allow the production of several differently doped subzones in one common processing step.

It has particularly been observed that a doping layer deposited on a subzone and in which dopants of a second dopant type are included, may, under suitably chosen circumstances, surprisingly have the effect that, in a subsequently performed heating of the such prepared silicon substrate, dopants of a first, other dopant type diffuse more strongly into the silicon substrate than is observed when no such doping layer was deposited.

Here, a doping layer may be understood as a layer containing significant quantities of an element doping silicon, i.e. a dopant. Here, atoms or generally particles of the dopant may be included in a material forming the layer. Mostly, the quantity of the dopant makes up only a portion of the layer, e.g. in concentrations in the range from 1e18 to 1e22 cm$^{-3}$. The dopant may be chosen such that the atoms or particles included in the layer do not significantly influence the electric properties of the layer itself. However, as soon as the atoms or particles diffuse into a neighboring semiconductor material, they there, by acting as electrically active impurities, cause a doping and thus change the electric behavior of the semiconductor material. The layer may for example be implemented as a dielectric layer in which dopants are included in a dielectric such as e.g. silicon oxide, silicon nitride or silicon carbide. Alternatively, it is conceivable to form the doping layer with other non-dielectric materials such as e.g. amorphous silicon.

In a concrete example, it has e.g. been observed that a doping silicon oxide layer in which boron is included as a second dopant type, i.e. a layer of borosilicate glass (BSG), may, at a suitably chosen layer thickness, have the effect that phosphorus as a first dopant type is diffused more strongly from a gas atmosphere into a subjacent silicon substrate at high temperatures than is the case when the subzone observed was not covered with the borosilicate glass layer.

Interestingly, it has been observed here that the in-diffusion of phosphorus is stronger than not only in a case in which the subzone is not covered with a dielectric layer at all but also than in a case in which a silicate glass layer indeed does cover the subzone but has no boron included therein.

The borosilicate glass layer therefore seems to substantially promote the diffusion of phosphorus into the subjacent silicon substrate, in other words act as a kind of "diffusion catalyst", wherein it may be that it is not the diffusion process itself that is accelerated but only that the phosphorus in the boric silicon oxide is effectively collected and forwarded on to the silicon substrate.

In order to better understand the influence of the boron in the borosilicate glass on the diffusion of phosphorus into the silicon substrate, experiments with silicon substrates were performed in which subzones of the substrate surface were coated with BSG and other subzones were coated with silicon oxide not enriched with dopants or were not coated at all. The silicon substrates were then heated up in a furnace to temperatures of more than 800° C. or even more than 900° C. On walls of the furnace, there had been produced, in the context of a preceding POCl$_3$ diffusion, phosphorus silicate glass (PSG), from which phosphorus was released at the high temperatures so that a phosphoric atmosphere could build up in the furnace. Alternatively, the heating of the silicon substrate could have been performed in an atmosphere in which the first dopant type and/or compounds containing the first dopant type are added. It has been observed that, after this high temperature step, a substantially higher phosphorus concentration could be measured in the silicon substrate in the zones previously coated with BSG than in the adjacent subzones that were not coated or were coated with silicon oxide not enriched with dopants.

Not having understood in detail the physical mechanisms underlying this at first surprising observation and without limiting the invention described herein and which utilizes the observed effects, it is presently assumed that the observed in-diffusing of phosphorus locally intensified by the BSG may be caused by the that phosphorus coming out of the surrounding atmosphere may be absorbed into the BSG layer and, as long as the layer is not too thick, i.e. has a thickness in particular of less than 400 nm, preferably less than 200 nm or 100 nm, may preferentially leave the layer to move to the subjacent silicon substrate and diffuse into its surface. Here, the boron also present in the BSG layer seems to support the absorption of phosphorus into the layer, i.e.

has a higher solubility or has a higher mobility within the layer than is the case with pure silicate glass not enriched with dopants.

The observed effect may for example be used to form different subzones in a silicon substrate which are each doped with the first dopant type.

The first dopant type may in these subzones be the only in-diffused dopant type or may at least predominate insofar as the first dopant type is present in a concentration which is higher than a concentration of further dopant types possibly also present. In other words, there may exist a further dopant type in these subzones, but only in a smaller concentration such that its influence is overcompensated by the first dopant type.

Here, the different subzones differ at least with respect to their concentrations of the first dopant type, i.e., there is at least one subzone with a heavier dopant concentration and at least one subzone with a lighter dopant concentration.

In the case of solar cells, this helps to build e.g. a selective emitter structure with heavily doped subzones to be easily electrically contacted, and with lightly doped zones showing little recombination.

Examinations of the different subzones produced by the described method have shown that, in those subzones that were covered with the BSG layer during the heating, in addition to the dominating phosphorus portion, significant concentrations of boron could also be measured. In this respect, e.g. manufactured silicon substrates of solar cells manufactured according to the invention differ from conventional solar cells with differently heavily phosphorus-doped zones in which heavier doped subzones were mostly produced by more phosphorus being diffused in due to the lack of diffusion barrier layers or less superficial silicon with a high phosphorus content being removed from the surface of the substrate due to a lack of local etching because of protection posed by etching barrier layers.

The examinations have further yielded that the boric p-type doping introduced in the first subzone has a special doping profile exhibiting a substantially steeper exponential decline of a doping concentration close to a surface of the silicon substrate than further removed from the surface of the silicon substrate. Such a doping profile is very unusual and differs greatly from doping profiles as generated conventionally when in-diffusing boron, where a doping concentration shows a substantially flatter exponential decline close to the surface of the silicon substrate than further removed from the surface of the silicon substrate.

Here, a steep exponential decline may be understood such that a logarithmically plotted curve showing the logarithm of the dopant concentration as a function of a depth, i.e. of a distance from the substrate surface, is steeply declining, i.e. has a large gradient.

The doping profile described seems to be a special result of the in-diffusion process described above in which phosphorus is diffused into the first subzones through a BSG and in the process of which the boron, which is also diffused in, albeit in a smaller quantity, is subject to changed diffusion conditions which presumably lead to the special doping profile observed.

The method described may be particularly advantageously supplemented to the effect that, in addition to the first and the second doped subzone, at least a third doped subzone doped with the second dopant type is produced in the silicon substrate. This may be achieved by the method comprising, prior to the heating, a supplemental covering of the doping layer with a further layer, particularly a dielectric layer acting as a diffusion barrier for the first dopant type, above the third doped subzone to be produced.

In the example described above, this means that the BSG layer is locally covered with a further layer, for example a dielectric layer, especially e.g. a silicon nitride layer acting as a diffusion barrier for the phosphorus present in a surrounding atmosphere. The further layer may be attributed its effect as a diffusion barrier by its density and/or thickness and/or composition. Thus, the diffusion barrier layer may prevent the phosphorus from reaching the subjacent BSG layer in any significant amount and from diffusing through the same into the silicon substrate in any significant amount, i.e. in a concentration comparable to that of the boron diffused into the substrate from the BSG layer. Accordingly, in the subsequent high temperature step, though boron is driven from the BSG layer into the subjacent silicon substrate and effects a local boron doping, there is not to any significant amount any additional in-diffusion of phosphorus also which could overcompensate the boron doping. As a result, the third subzone is p-type-doped.

In other words, prior to the high-temperature step, three different subzones are produced at the silicon substrate, that is a first subzone which is covered by the BSG layer only, a second subzone which is not covered by the BSG layer and a third subzone which is covered both by the BSG layer and on top of that by a diffusion barrier layer. In the first subzone, during the high temperature step, a heavy phosphorus concentration and a light, overcompensated boron concentration which, however, lies significantly above a possible basic boron doping of the substrate, develop in the silicon substrate. In the second subzone, only a light phosphorus concentration simultaneously develops without there also developing any boron concentration lying significantly above a possible basic boron doping of the substrate. In the third subzone, only a light boron concentration which, however, lies significantly above a possible basic boron doping of the substrate simultaneously develops, without there also developing any phosphorus concentration. Here, those skilled in the art understand that due to secondary influences, small quantities of other dopants, e.g. due to the above mentioned possible basic doping of the substrate up to typically $10^{17}$ cm$^{-3}$ or e.g. due to the use of co-doped or partly compensated substrates, may be contained in each of the subzones which, however, are insignificant with regard to the effect of the predominant doping. Furthermore, the intensity of the dopings in the subzones may also be dependent on the BSG layer, the diffusion barrier layer, the atmosphere in the diffusion furnace, the diffusion temperature and the diffusion time. It is therefore evident that the individual subzones may be doped lighter or heavier in each case, depending on the choice of these parameters.

The method described may thus be used to form, in the context of one single high temperature step, three differently doped zones in a silicon substrate, i.e. two subzones differently heavily doped with a first dopant type as well as at least one subzone doped with a second dopant type. Here, the first and the second dopant type exhibit opposite polarities.

This fact may be of advantage particularly in the manufacturing of silicon solar cells, e.g. in order to manufacture, easily and at low cost, solar cells designed such that they require the above mentioned three differently doped zones. As described further below in more detail, e.g. back contact solar cells, in particular IBC solar cells, where, possibly after the deposition of suitable passivation layers, finally metal contacts for electrically contacting the oppositely doped subzones of the silicon substrate are produced, may advantageously be manufactured.

With such solar cells, the p-type doping introduced in the third subzone shows a doping profile which exhibits a substantially flatter exponential decline of a doping concentration close to a surface of the silicon substrate than further removed from the surface of the silicon substrate. In other words, the overcompensated boron doping in the first subzone and the non-overcompensated boron doping in the third subzone exhibit qualitatively markedly different doping profiles.

It is to be noted that possible features and advantages of embodiments of the invention are described herein partly with regard to a method of producing differently heavily doped subzones in a silicon substrate, partly with regard to a method of manufacturing a solar cell and partly with regard to a solar cell. A person skilled in the art will understand that the features may conveniently be combined, transferred or exchanged in order to arrive at further embodiments of the invention.

BRIEF DESCRIPTION OF THE DRAWINGS

In the following, embodiments of the invention are described with regard to the accompanying drawings, wherein neither the description nor the drawings are to be interpreted as limiting the invention.

Figure 1:
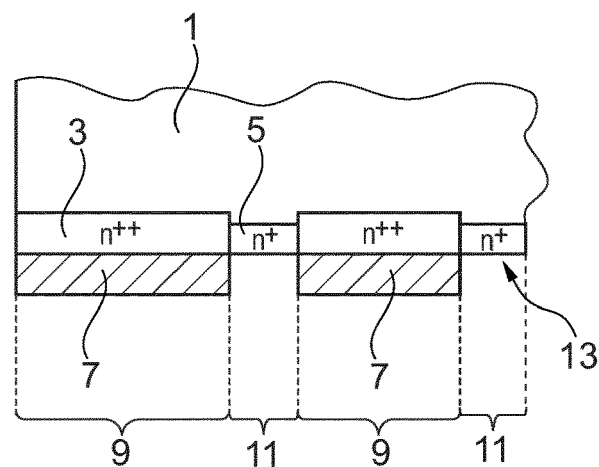
FIG. 1 shows a cross-sectional view of a silicon substrate in which differently doped subzones are produced according to an embodiment of the present invention.

The figures are only schematic and not true to scale. Like reference signs in the various figures denote like features or features having like effects.

DETAILED DESCRIPTION OF EMBODIMENTS

For the manufacturing of a silicon solar cell, generally, it is necessary or advantageous to dope subzones of a surface of a silicon substrate negatively, i.e. in an n-type manner, in order to, e.g. in a p-type substrate, achieve an emitter, or to, in an n-type substrate, keep charge carriers away from a recombination-active surface and therefore better passivate the same. Here, it may be of advantage to realize differently heavily doped zones within a substrate, e.g. in order to generate a selective emitter in which heavily doped subzones may be contacted by metal contacts with low resistance and intermediate lightly doped zones may be well surface-passivated.

For the manufacturing of a solar cell on the basis of a silicon substrate, it is generally also necessary to dope other subzones of the silicon substrate positively, i.e. in a p-type manner, in order to achieve, for these subzones too, a sufficiently good contact with a contact metallization or in order to keep charge carriers away from the surface or in order to produce an emitter in an n-type substrate.

In the concrete example of a back contact solar cell, as a rule, it is necessary to produce both negative and positive doped subzones on a back side surface of the silicon substrate. i.e. on a surface facing away from the sun during operation. Furthermore, the front side of the silicon substrate, i.e. the surface facing the sun in operation, too, should, in proximity to the surface, exhibit an increased basic doping concentration, for example in the form of an FSF (Front Surface Field) in order to minimize any surface recombination there.

For the production of negatively doped subzones in crystalline silicon, phosphorus is generally used as a doping agent, i.e. as a dopant. In an industrial fabrication of solar cells, doped subzones are e.g. produced for example by diffusing phosphorus out of a phosphoric glass layer (phosphorus silicate glass, PSG) into the silicon substrate. The phosphoric glass layer is first segregated, e.g. by inducing $POCl_3$-gas into the pipe of a furnace. For the actual in-diffusion of the phosphorus, high temperatures of typically more than 800° C. and long diffusion times of typically more than 20 min are required, wherein higher temperatures tend to shorten the diffusion time. Here, mostly batch diffusion furnaces are used in which both the production of the PSG layer and the in-diffusion into the substrate are carried out. During the doping process, however, only a small quantity of the phosphorus used enters the substrate, a larger quantity remains in the glass layer on the substrate or a glass layer on an inner wall of the furnace pipe and stays there unused or leaves the furnace via the gas exiting, same.

For the production of subzones differently heavily doped with phosphorus, generally one or more diffusion steps combined with suitable masking and/or etching measures have been used so far. As a masking for a phosphorus diffusion, e.g. a silicon nitride ($SiN_x$) or silicon oxide ($SIO_x$) layer of sufficient thickness is used. Here, a barrier effect of silicon nitride is, as a rule, greater than one of silicon oxide, so that for example reduced layer thicknesses may be applied.

For the production of positively doped subzones in crystalline silicon, generally aluminum or boron is used. As boron exhibits a higher solid body solubility in silicon, it is preferably used for the production of heavily doped p-type zones. Boron is typically in-diffused at higher temperatures than phosphorus. e.g. at above 900° C.

Conventionally, two or more separate diffusion steps are necessary for the production of both phosphorus-doped subzones and boron-doped subzones. Alternatively, one or more doping sources may be applied and dopants may be in-diffused together in one diffusion step. Here, additional masking and/or etching steps may be applied in each case. In order to additionally produce differently heavily phosphorus-doped subzones, further masking and/or etching steps must be used on a regular basis.

FIG. 1 illustrates a first embodiment of an inventive method with which two differently heavily phosphorus-doped subzones 3, 5 may be produced in a silicon substrate 1.

On a surface 13 of the silicon substrate 1, partial surfaces 9 are covered with a borosilicate glass layer 7 (BSG, here corresponding to SiOxNy:B). Other partial surfaces 11 remain uncovered. The BSG 7 typically serves as a solid body doping source.

In experiments, is has been found that this BSG layer 7 is able to enhance a phosphorus diffusion process e.g. for certain process atmospheres in an industry-standard phosphorus diffusion furnace. Presumably, the BSG layer 7 serves for the absorption of phosphorus from the process atmosphere, i.e. of for example phosphorus from the furnace pipe walls "provided with a p-containing layer", and for the discharge of this phosphorus onto the silicon substrate 1 and therefore for the doping of the substrate 1. The BSG layer 7 enhances the absorption of phosphorus into the silicon substrate 1 in the partial surfaces 9 covered with BSG in contrast to the case of the partial surfaces 11 without any covering BSG layer 7. The BSG layer 7 enhances the absorption of phosphorus into the silicon substrate 1 also compared with the case in which the partial surface is covered with a silicon oxide layer not enriched with any doping agents.

As illustrated in FIG. 1, thus, by the local depositing of a BSG layer 7 and subsequent heating to above 800° C., first subzones 3 may be produced below the BSG layer 7 and second subzones 5 may be produced in places where no BSG layer is provided. Surprisingly here, the first subzones 3 are more heavily phosphorus-doped, i.e. $n^{++}$-doped, than the second subzones 5, which are $n^+$-doped.

It has particularly been found that, for a silicon substrate 1 with the BSG layer 7 deposited thereon, a high-temperature step of temperatures above 900° C. leads to an in-diffusion of phosphorus in a $POCl_3$ diffusion furnace previously covered with PSG without any phosphoric process gases being added. Here, a preliminary performance of industry-standard phosphorus diffusions suffices for covering the diffusion pipe of the furnace. A silicon substrate 1 without such a BSG layer 7 is in this process only doped with phosphorus in a much lighter fashion. In the performance of a subsequent typical phosphorus diffusion at temperatures below 900° C. with the addition of $POCl_3$, the substrate 1 is overall more heavily doped than by the previous phosphorus diffusion alone.

Thus, with the help of respectively structured BSG layers 7, phosphorus-doped subzones 3, 5 may selectively be realized in a silicon substrate 1.

Figure 2:
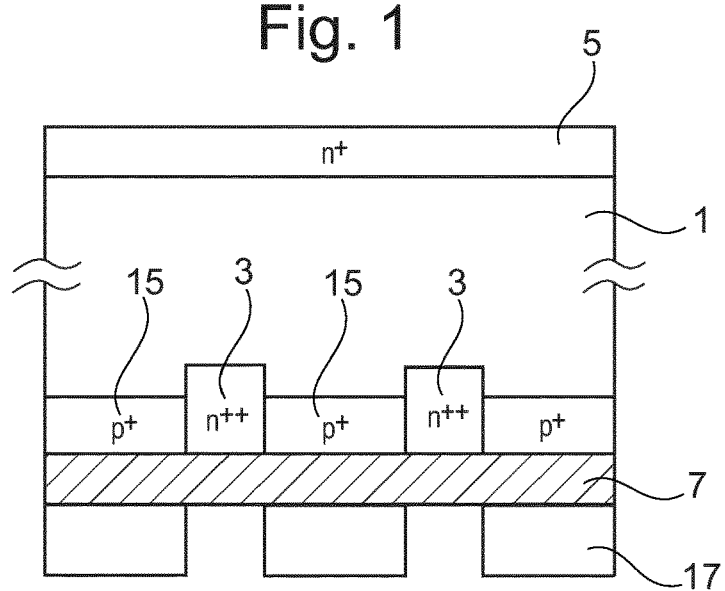
FIG. 2 shows a cross-sectional view of a silicon substrate in which differently doped subzones are produced according to an embodiment of the present invention.

FIG. 2 illustrates a second embodiment of an inventive method with which both two differently heavily phosphorus-doped subzones 3, 5 and a boron-doped subzone 15 may be produced in a silicon substrate 1 within a high temperature process step. Here, heavily $n^{++}$-phosporus-doped subzones 3 are located on the back side of the silicon substrate 1 between neighboring p-boron-doped subzones 15. A more lightly $n^+$-phosphorus-doped subzone 5 is located on the front side of the silicon substrate 1.

Here, the $p^+$-boron-doped subzones 15 may be produced by depositing a layer 17 acting as a diffusion barrier locally onto a previously deposited BSG layer 7. Alternatively, a layer 17 acting as a diffusion barrier may be applied onto the whole surface and subsequently be locally removed in other zones. The layer 17 prevents significant amounts of phosphorus reaching the BSG layer 7 in a subsequent phosphorus diffusion process. Thus, in the associated high temperature step, only boron is in significant quantities driven form the BSG layer 7 into the silicon substrate 1 in the subzones masked by the layer 17, and the subzones 15 undergo a relatively light boron doping. Here, a doping concentration in proximity to the surface may for example be greater than $1e19$ cm$^{-3}$, or greater than $5e18$ cm$^{-3}$ for thin BSG layer less than 15 nm thick. Here, a profile depth may typically be greater than 0.2 or 0.1 μm. With high diffusion temperatures and long diffusion times, profile depths of more than 0.5 μm are however also possible. Generally, the intensity of the doping depends among other things on the BSG layer, the diffusion barrier layer, the diffusion temperature and the diffusion time.

Intermediate, heavily $n^{++}$-phosphorus-doped subzones 3 are produced, in a similar manner as described above, in areas in which the BSG layer 7 is not masked and may therefore have enhancing effect on an in-diffusion of phosphorus. Here, a doping concentration close to the surface may for example be heavier than $1e20$ cm$^{-3}$. Here, a profile depth may typically be greater than 0.3 μm. With high diffusion temperatures, heavy pipe coverage and/or long diffusion times, profile depths of more than 0.6 μm are however also possible. With low diffusion temperatures, light pipe coverage and/or short diffusion times, profile depths in the range from 0.1 to 0.3 μm are also possible. Here, the intensity of the doping depends among other things on the BSG layer, the atmosphere in the diffusion furnace, the diffusion temperature and the diffusion time.

On the front side, a relatively lightly $n^+$-doped subzone 5 is produced, as there neither a layer 17 as a diffusion barrier nor a BSG layer 7 enhancing an in-diffusion is active. In order to achieve sufficient coverage of PSG on the furnace pipe, a surface concentration may typically amount to more than $1e19$ cm$^{-3}$, and a profile depth may typically be greater than 0.2 μm, wherein possible implementations include no profile for a furnace pipe having no coverage thereon and a more marked profile for a furnace pipe with a heavier deposition thereon.

By way of example, in the following, possible parameters in an inventive production of doped subzones 3, 5, 15 are given.

The silicon substrate 1 may be a crystalline n-type silicon wafer (c-Si). It may have a thickness of more than 50 μm, typically between 100 and 300 μm. A base concentration may range from $1e14$ to $5e16$ cm$^{-3}$, which corresponds to a conductivity in a range from 0.1 to 50 Ohm*cm.

The BSG layer 7 may for example be produced by chemical vapor deposition (CVD), e.g. by PECVD (Plasma Enhanced CVD). However, other deposition techniques such as sputtering, evaporation deposition, imprinting of thin layers (possibly repressed/converted) may also be used. The BSG layer 7 may be formed with a layer thickness of less than 400 nm, preferably less than 100 nm and particularly a thickness in the range from 5 to 100 nm. A concentration of boron in the BSG layer may be effected by e.g. addition of diborane ($B_2H_6$) during a deposition process. As an example, boron may be included in a silicon oxide matrix at a concentration of $1e21$ to $1e22$ cm$^{-3}$.

An in-diffusion of phosphorus from a gas atmosphere on the one hand and of boron from the BSG layer 7 on the other hand may be carried out at temperatures of more than 800° C., preferably more than 900° C., for example at 920° C., wherein, with the temperature increasing, a decreased process time may be chosen and may e.g. have a duration between a few minutes and several hours. At 920° C., a process time may e.g. be 100 min. Subsequently, after this driving-in step, a $POCl_3$ diffusion may optionally be performed at lower temperatures, for example below 850° C., particularly for example at 830° C.

Figure 3:
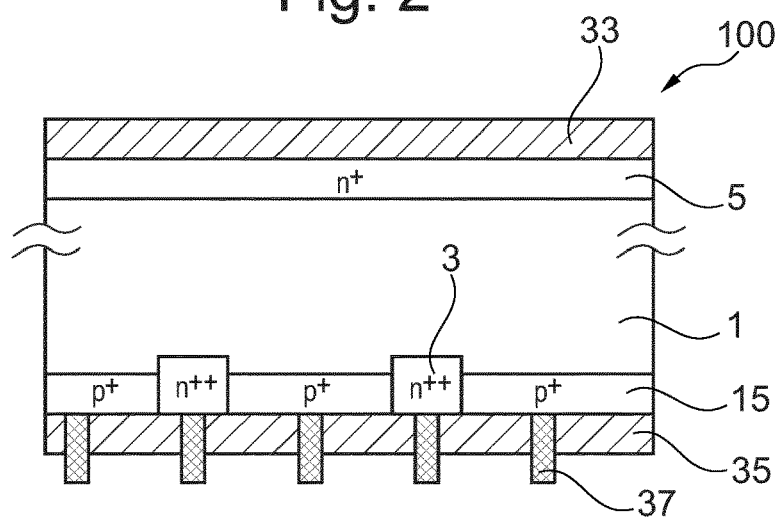
FIG. 3 shows a cross-sectional view of a back contact solar cell according to an embodiment of the present invention.

FIG. 3 shows a cross section through an inventively manufactured solar cell 100 in the form of an IBS solar cell. The layers 7, 17 used in producing differently doped subzones 3, 5, 15, as they are shown in FIG. 2, were removed after the high temperature step, e.g. by etching. Then, on the front side of the silicon substrate 1, one or more dielectric layers 33, for example of silicon nitride and/or silicon oxide, which may serve for a surface passivation and/or as an anti-reflex layer were produced. On the back side of the silicon substrate 1, too, one or more dielectric layers 35 which may particularly serve for a surface passivation were formed. Furthermore, metal contacts 37 contacting oppositely doped subzones 3, 15 on the back side of the silicon substrate 1 through the dielectric layer 35 were formed. The metal contacts may e.g. be imprinted or vapor deposited, and, if applicable, subsequently be fired, sintered or alloyed or for example be realized as Laser Fired Contacts (LFCs).

Figure 4:
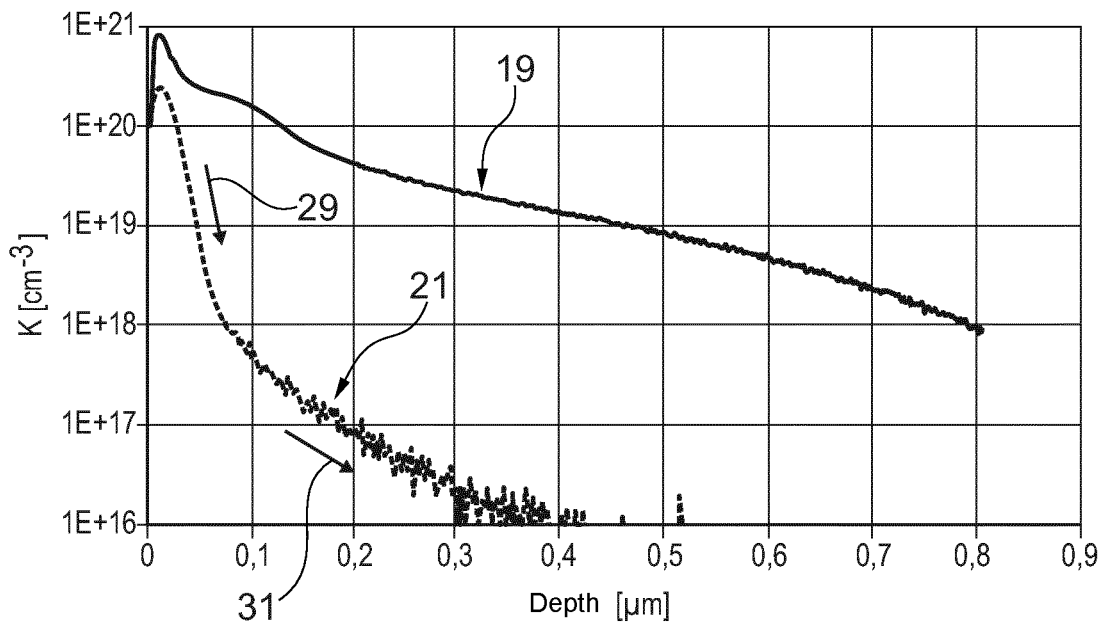
FIG. 4 shows doping profiles of a subzone in a silicon substrate produced in accordance with the invention.
Figure 5:
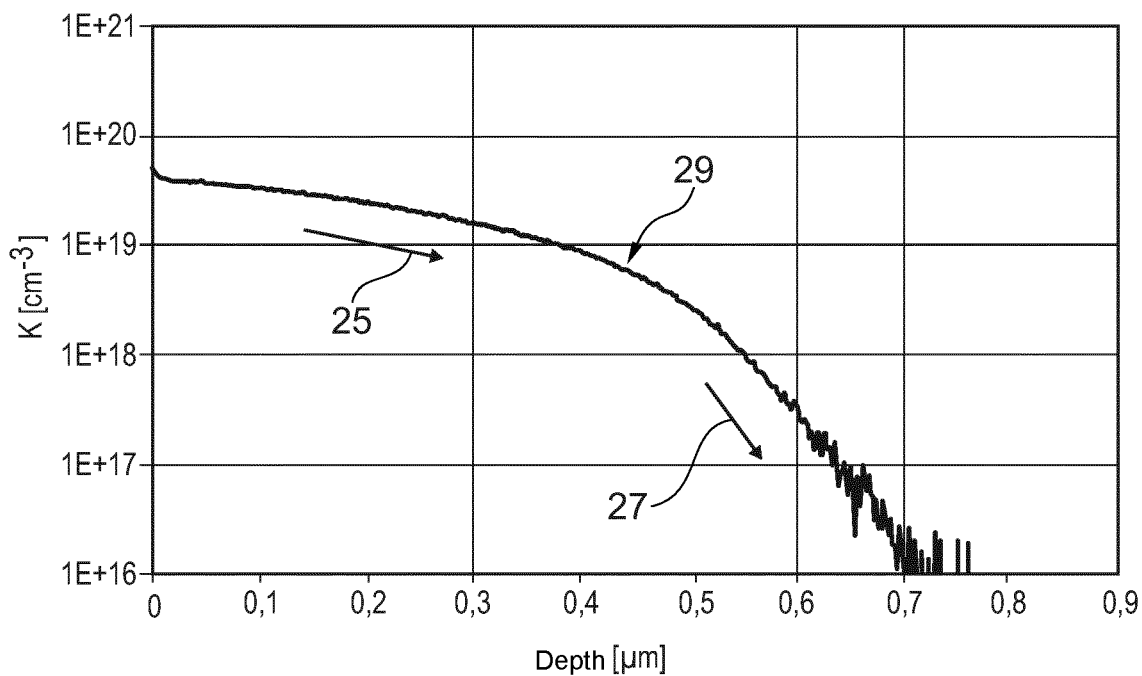
FIG. 5 shows a doping profile of a further subzone in a silicon substrate produced in accordance with the invention.

With respect to FIGS. 4 and 5, doping profiles of in-diffused dopants are described as they typically materialize in inventively produced subzones 3, 15. The graphs depicted were measured by SIMS (Secondary Ion Mass Spectrometry) and thus reflect the actual concentration of dopants and not only the concentration of electrically active dopants.

FIG. 4 shows doping profiles 19, 21 in a first subzone 3. The doping profile 19 describes the concentration K of phosphorus as a function of the depth T, i.e. as a function of a distance from a surface of the silicon substrate 1. The doping profile 21 describes the concentration K of boron as a function of the depth.

In subzone 3, both dopants occur, however, the phosphorus concentration clearly predominates so that subzone 3 is to be regarded as predominantly n-type doped.

FIG. 5 shows a doping profile 23 in a third subzone 15. The doping profile 23 describes the concentration K of boron as a function of the depth T. In subzone 15, boron is the only dopant occurring as an in-diffusion of phosphorus in any significant amount is prevented by the masking layer 17 so that subzone 15 is to be regarded as p-type doped.

Interestingly, the two boron doping profiles 21, 23 greatly differ from each other in terms of quality in subzones 3, 15.

The doping profile 23 of FIG. 5 corresponds to a typical doping profile as it is known when in-diffusing boron from a solid body doping source such as BSG. Close to the surface, the doping concentration at first declines only slightly in the logarithmic plotting depicted, as illustrated by the flat gradient 25. In the case shown, the exponential decline of the doping concentration only starts to increase when greater depths of more than 0.4 μm are reached, as illustrated by the steeper gradient 27. The in-diffusion of boron at a different temperature or a different duration leads to an extension/compression of the depth scale, the qualitative course remains unchanged.

The doping profile 21 of FIG. 4 for boron differs greatly therefrom. Close to the surface, the doping concentration at first declines strongly down to a depth of approximately 0.1 μm in the logarithmic plotting illustrated, as shown by the steep gradient 29. At greater depths of more than approximately 0.1 μm, the exponential decline of the doping concentration decreases, as illustrated by the flatter gradient 31.

Such a doping profile seems unusual and is most likely caused by the specific diffusion conditions as they occur in the above-described in-diffusion of phosphorus at the simultaneous presence of a BSG layer 7 serving as a boron source.

Conclusively, it is to be noted that the terms "include", "comprise", etc. are not meant to exclude the existence of further additional elements. The term "one" does not exclude the existence of a plurality of elements or objects. Furthermore, in addition to the method steps named in the claims, further method steps may be necessary or advantageous in order to e. g. ultimately complete the production of a solar cell. The reference signs in the claims only serve to enhance readability and are not meant to in any way limit the scope of the claims.

LIST OF REFERENCE SIGNS 1 silicon substrate
3 first subzone
5 second subzone
7 BSG layer
9 first partial surface
11 second partial surface
13 back-side surface
15 third subzone
17 layer acting as a diffusion barrier
19 phosphorus doping profile in subzone 3
21 boron doping profile in subzone 3
23 boron doping profile in subzone 15
25 near-surface gradient of the boron doping profile in sub one 15
27 distant-surface gradient of the boron doping profile in subzone 15
29 near-surface gradient of the boron doping profile in subzone 3
31 distant-surface gradient of the boron doping profile in subzone 3
33 dielectric layer
35 dielectric layer
37 metal contacts

The invention claimed is:

1. A method of producing at least a first and a second differently heavily doped subzones predominantly doped with a first dopant type in a silicon substrate, the first and the second differently heavily doped subzones abutting to a first surface at one side of the silicon substrate, the method comprising:
covering a partial area of the first surface on at least the first subzone of the silicon substrate in which a heavier doping with the first dopant type is to be produced with a doping layer of borosilicate glass, wherein a partial area of the first surface on at least the second subzone of the silicon substrate in which a lighter doping with the first dopant type is to be produced is not covered with the doping layer, and wherein boron as a dopant of a second dopant type differing from the first dopant type and oppositely polarized with respect to the first dopant type is included in the doping layer; and
heating the silicon substrate to temperatures above 800° C. in a furnace in an atmosphere containing significant quantities of the first dopant type.

2. The method of claim 1, wherein the first dopant type is phosphorus.

3. The method of claim 1, wherein the doping layer is produced at a thickness of less than 400 nm.

4. The method of claim 1, wherein the heating of the silicon substrate is performed within a furnace having walls, wherein an inside of the walls is covered with a layer of phosphorus silicate glass.

5. The method of claim 1, wherein the heating of the silicon substrate is performed in an atmosphere to which the first dopant type and/or compounds containing the first dopant type are added.

6. The method of claim 1, wherein, in the silicon substrate, supplementary, at least a third doped subzone doped with the second dopant type is produced by the method supplementary comprising, prior to the heating, a covering of the doping layer, above the third doped subzone to be produced, with a further layer acting as a diffusion barrier for the first dopant type.

7. The method of claim 6, wherein the further layer acting as a diffusion barrier for the first dopant type is a dielectric layer.

8. A method of producing a solar cell, comprising:
providing the silicon substrate;
producing at least two differently heavily doped subzones doped with a first dopant type in the silicon substrate according to the method of claim 1; and
producing metal contacts for electrically contacting various doped subzones of the silicon substrate.

9. A method of producing a solar cell, comprising:
providing the silicon substrate;
producing at least two differently heavily doped subzones doped with a first dopant type as well as at least one doped subzone doped with a second dopant type in the silicon substrate by the method of claim 6, wherein the first and the second dopant type exhibit opposite polarities;
producing metal contacts for electrically contacting oppositely doped subzones of the silicon substrate.

10. The method of claim 8, wherein the solar cell is a back contact solar cell.

11. The method of claim 9, wherein the solar cell is a back contact solar cell.

12. The method of claim 1, wherein the silicon substrate is heated to temperatures above 900° C. in the furnace in the atmosphere containing significant quantities of the first dopant type.

13. The method of claim 1, wherein the doping layer is produced at a thickness of less than 100 nm.

14. The method of claim 7, wherein the dielectric layer is a silicon nitride layer.

* * * * *